US010909916B2

(12) United States Patent
Feng et al.

(10) Patent No.: US 10,909,916 B2
(45) Date of Patent: Feb. 2, 2021

(54) OLED ARRAY SUBSTRATE, OLED DISPLAY PANEL, PIXEL CIRCUIT, DRIVING METHOD AND METHOD FOR FINGERPRINT RECOGNITION USING OLED DISPLAY PANEL

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiang Feng, Beijing (CN); Long Han, Beijing (CN); Yipeng Chen, Beijing (CN); Minghua Xuan, Beijing (CN); Ruizhi Yang, Beijing (CN); Sha Liu, Beijing (CN); Xiao Sun, Beijing (CN); Qiang Zhang, Beijing (CN); Zhaokun Yang, Beijing (CN); Yun Qiu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/876,697

(22) Filed: May 18, 2020

(65) Prior Publication Data
US 2020/0279527 A1 Sep. 3, 2020

Related U.S. Application Data

(63) Continuation of application No. 16/071,616, filed as application No. PCT/CN2017/104737 on Sep. 30, 2017, now Pat. No. 10,720,099.

(30) Foreign Application Priority Data

Apr. 27, 2017 (CN) .......................... 2017 1 0287382

(51) Int. Cl.
*G09G 3/3225* (2016.01)
*G06F 3/041* (2006.01)
(Continued)

(52) U.S. Cl.
CPC ......... *G09G 3/3225* (2013.01); *G06F 3/0416* (2013.01); *G06K 9/0004* (2013.01); *G09G 3/3677* (2013.01); *G09G 3/3688* (2013.01)

(58) Field of Classification Search
CPC ...... G06F 3/0416; G06F 3/0412; G06F 3/042; G06F 3/044; G09G 3/3225; G09G 3/3677;
(Continued)

(56) References Cited

U.S. PATENT DOCUMENTS

2009/0174731 A1 7/2009 Kim et al.
2015/0302793 A1 10/2015 In et al.
(Continued)

FOREIGN PATENT DOCUMENTS

CN  103354078 A  10/2013
CN  103996376 A  8/2014
(Continued)

OTHER PUBLICATIONS nternational Search Report from PCT Application No. PCT/CN2017/104737 dated Jan. 31, 2018 (4 pages).
(Continued)

*Primary Examiner* — Deeprose Subedi
(74) *Attorney, Agent, or Firm* — Dave Law Group LLC; Raj S. Dave

(57) ABSTRACT

The embodiments of the present disclosure disclose an OLED array substrate. The OLED array substrate comprises: a plurality of scan lines; a plurality of data lines; a plurality of OLED pixel units, each OLED pixel unit is connected to a corresponding data line and a corresponding
(Continued)

scan line and being connected to a corresponding reset terminal; and a plurality of light detection units, each light detection unit is connected between the reset terminal of one OLED pixel unit and the corresponding data line, is configured to detect a light emitted by a detection light resource to generate a light detection signal, and output the light detection signal via the corresponding data line under a control of a reset signal from the reset terminal.

16 Claims, 4 Drawing Sheets

(51) Int. Cl.
*G06K 9/00* (2006.01)
*G09G 3/36* (2006.01)

(58) Field of Classification Search
CPC ...... G09G 3/3688; G09G 3/32; G09G 3/3208; G09G 3/3233; G09G 2320/0233; G09G 2300/0819; G09G 2300/0842; G09G 2300/0861; G06K 9/0004
See application file for complete search history.

(56) References Cited

U.S. PATENT DOCUMENTS

| 2015/0302801 | A1 | 10/2015 | Tan et al. |
| 2016/0062522 | A1 | 3/2016 | Yang |
| 2016/0181563 | A1 | 6/2016 | Cho et al. |
| 2016/0253014 | A1* | 9/2016 | Yang .................... G09G 3/3208 345/174 |
| 2017/0220839 | A1 | 8/2017 | Yang et al. |

FOREIGN PATENT DOCUMENTS

| CN | 105095877 A | 11/2015 |
| CN | 106898636 A | 6/2017 |

OTHER PUBLICATIONS

Written Opinion from PCT Application No. PCT/CN2017/104737 dated Jan. 31, 2018 (5 pages).
Final Office action of U.S. Appl. No. 16/071,616, dated Feb. 19, 2020 (20 Pages).
Non-Final Office action of U.S. Appl. No. 16/071,616, dated Nov. 18, 2019 (15 Pages).
Notice of Allowance of U.S. Appl. No. 16/071,616, dated Nov. 18, 2019 (11 Pages).

* cited by examiner

OLED ARRAY SUBSTRATE, OLED DISPLAY PANEL, PIXEL CIRCUIT, DRIVING METHOD AND METHOD FOR FINGERPRINT RECOGNITION USING OLED DISPLAY PANEL

CROSS-REFERENCE TO RELATED APPLICATIONS

This application is a continuation of U.S. patent application Ser. No. 16/071,616, filed on Jul. 20, 2018, which is a National Stage Entry of PCT/CN2017/104737, filed on Sep. 30, 2017, which claims priority of China Patent Application No. 201710287382.4, filed on Apr. 27, 2017, the entire content of which is incorporated herein by reference as part of this application.

TECHNICAL FIELD

Embodiments of the present disclosure relate to a field of display technology, and in particular, to an organic light emitting diode (OLED) array substrate, an OLED display panel, a pixel circuit, a driving method and a method for fingerprint recognition using the OLED display panel.

BACKGROUND

With the development of display technology, many display devices such as mobile phones, tablet computers or the like have fingerprint recognition functions. Current fingerprint recognition sensors can comprise three types. The first type is an optical sensor which has a larger size. The second type is a capacitive sensor, the dots per inch (dpi) required by which is higher. The third type is an ultrasonic sensor.

SUMMARY OF THE INVENTION

The embodiments of the present disclosure provide an OLED array substrate, an OLED display panel, a pixel circuit, a driving method and a method for fingerprint recognition using the OLED display panel, which can perform fingerprint recognition while displaying without affecting the accuracy of fingerprint recognition.

According to a first aspect of the embodiments of the present disclosure, there is provided an OLED array substrate. The OLED array substrate comprises a plurality of scan lines, a plurality of data lines, and a plurality of OLED pixel units. Each of the OLED pixel units may be connected to a corresponding data line and a corresponding scan line and being connected to a corresponding reset terminal. The OLED array substrate further comprises a plurality of light detection units. Each of the light detection units may be connected between the reset terminal of one of the OLED pixel units and the corresponding data line and be configured to detect a light emitted by a detection light resource to generate a light detection signal. In addition, each of the light detection units can also output the light detection signal via the corresponding data line under a control of a reset signal from the reset terminal.

In an embodiment of the present disclosure, each of the OLED pixel units comprises a plurality of sub-pixel units. One of the light detection units may be connected between the reset terminal of at least one of the sub-pixel units and the corresponding data line.

In an embodiment of the present disclosure, the light detection unit comprises a first transistor and a photodetector. A first electrode of the first transistor is coupled to the corresponding data line. A second electrode of the first transistor is coupled to the photodetector. A control electrode of the first transistor is coupled to the reset terminal.

In an embodiment of the present disclosure, a orthographic projection of the light detection unit on a substrate of the OLED array substrate does not overlap with a orthographic projection of an organic light emitting layer of the OLED pixel unit on the substrate.

In an embodiment of the present disclosure, the photodetector may comprise a photodiode.

In an embodiment of the present disclosure, the detection light resource is the OLED pixel unit.

In an embodiment of the present disclosure, the light emitted by the detection light resource is monochromatic light.

According to a second aspect of the embodiments of the present disclosure, there is provided an OLED display panel comprising the above-described OLED array substrate. The OLED display panel further comprises a transparent substrate disposed opposite to the OLED array substrate and a fingerprint recognition unit which is connected to the plurality of data lines and is configured to recognize a fingerprint pattern based on the light detection signals from the plurality of data lines.

In an embodiment of the present disclosure, the light emitted by the detection light resource is a light reflected by the transparent substrate.

According to a third aspect of the embodiments of the present disclosure, there is provided a pixel circuit for the above-described OLED display panel. The pixel circuit comprises a light emitting drive circuit being configured to control an OLED pixel unit to emit light; and a light detection unit being configured to detect a light emitted by a detection light resource to generate a light detection signal.

In an embodiment of the present disclosure, the light detection unit comprises a first transistor and a photodetector, a first electrode of the first transistor is coupled to a corresponding data line, a second electrode of the first transistor is coupled to the photodetector, and a control electrode of the first transistor is coupled to a reset terminal.

In an embodiment of the present disclosure, the light emitting drive circuit comprises a capacitor, an initialization transistor, a second transistor, a third transistor, a fourth transistor, a fifth transistor, a sixth transistor, a driving transistor, and an OLED light emitting device. A control electrode of the initialization transistor is coupled to the reset terminal, a first electrode of the initialization transistor is coupled to a first terminal of the capacitor, and a second electrode of the initialization transistor is used for receiving an initial supply voltage. A control electrode of the second transistor is coupled to a corresponding scan line, a first electrode of the second transistor is coupled to a second electrode of the driving transistor, and a second electrode of the second transistor is coupled to the first terminal of the capacitor. A control electrode of the third transistor is coupled to the corresponding scan line, a first electrode of the third transistor is coupled to the corresponding data line, and a second electrode of the third transistor is coupled to a first electrode of the driving transistor. A control electrode of the fourth transistor is coupled to a light emission control signal line, a first electrode of the fourth transistor is coupled to the first electrode of the driving transistor, and a second electrode of the fourth transistor is coupled to a second terminal of the capacitor. A control electrode of the fifth transistor is coupled to the light emission control signal line, a first electrode of the fifth transistor is coupled to the OLED light emitting device, and a second electrode of the fifth transistor is coupled to the second electrode of the driving transistor. A control electrode of the sixth transistor is coupled to the reset terminal, a first electrode of the sixth transistor is used for receiving the initial supply voltage, and a second electrode of the sixth transistor is coupled to the OLED light emitting device. A control electrode of the driving transistor is coupled to the first terminal of the capacitor, the first electrode of the driving transistor is coupled to the first electrode of the fourth transistor, and the second electrode of the driving transistor is coupled to the second electrode of the fifth transistor.

According to a fourth aspect of the embodiments of the present disclosure, there is provided a driving method of the above-described pixel circuit. The pixel circuit comprises during a first time period, resetting an OLED pixel unit, during a second time period, storing a data voltage for displaying, and during a third time period, driving the OLED pixel unit to emit light.

According to a fifth aspect of the embodiments of the present disclosure, there is provided a method for fingerprint recognition using the above-described OLED display panel. In this method, it is detected that a user's finger touching the OLED display panel. An OLED pixel unit of the OLED display panel is controlled to emit a light for fingerprint recognition. Then, in a reset stage of the OLED pixel unit of the OLED display panel, a light detection signal is obtained, wherein the light detection signal is generated by detecting the light for fingerprint recognition reflected by the transparent substrate of the OLED display panel. Finally, based on the light detection signal, a fingerprint pattern of the user's finger can be recognized.

In an embodiment of the present disclosure, a region for fingerprint recognition may also be provided in a display region of the OLED display panel. In addition, the detecting that a user's finger touching the OLED display panel may comprise detecting that a user's finger touching the region for fingerprint recognition for a predetermined time.

In an embodiment of the present disclosure, the light for fingerprint recognition is monochromatic light.

According to a sixth aspect of the embodiments of the present disclosure, there is provided an electronic device which comprises the above-described OLED display panel.

Further aspects and areas of applicability will become apparent from the description provided herein. It should be understood that various aspects of this application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION OF THE INVENTION

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

Example embodiments will now be described more fully with reference to the accompanying drawings.

In an embodiment of the present disclosure, an OLED display panel is provided. The OLED display panel can perform fingerprint recognition while displaying without affecting the accuracy of fingerprint recognition.

Figure 1:
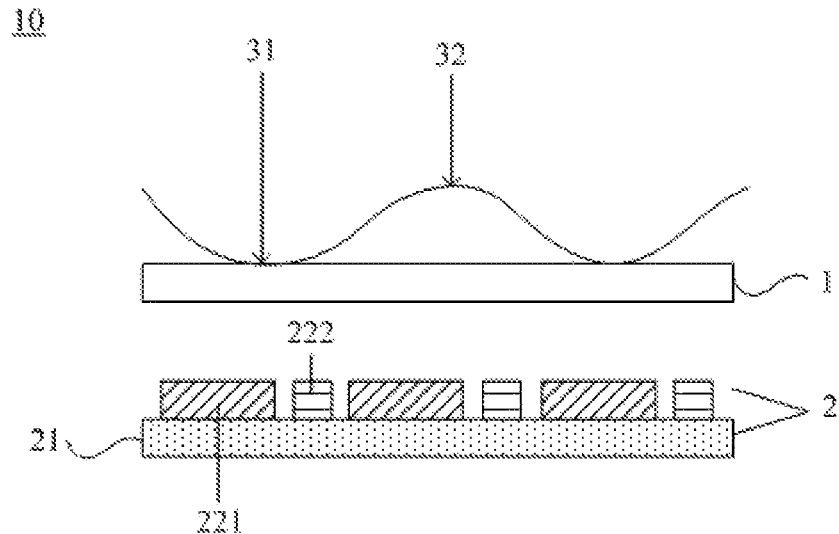
FIG. 1 is a schematic view of a cross section of an OLED display panel according to an embodiment of the present disclosure.

FIG. 1 is a schematic view of a cross section of an OLED display panel 10 according to an embodiment of the present disclosure. As shown in FIG. 1, the OLED display panel 10 comprises a transparent substrate 1 and an OLED array substrate 2 disposed opposite to the transparent substrate 1. The OLED array substrate 2 comprises: a substrate 21; and an OLED pixel unit 221 and a light detection unit 222 on the substrate 21. Each light detection unit 222 may be connected between a reset terminal of one OLED pixel unit 221 and a data line. The OLED display panel 10 further comprises a fingerprint recognition unit (not shown).

In the embodiments of the present disclosure, each light detection unit 222 is configured to detect a light emitted by a detection light resource to generate a light detection signal and output the light detection signal via the data line under a control of a reset signal from the reset terminal.

In an exemplary embodiment, the detection light resource is the OLED pixel unit.

In an exemplary embodiment, the light emitted by the detection light resource is monochromatic light.

In an exemplary embodiment, the light emitted by the detection light resource is a light reflected by the transparent substrate.

In an exemplary embodiment, the transparent substrate 1 may be a substrate which can transmit light. As an example, the transparent substrate 1 is a glass substrate. As another example, the transparent substrate 1 may be made of a transparent flexible material.

In an exemplary embodiment, the OLED pixel unit 221 may comprise a plurality of sub-pixel units. For example, an OLED pixel unit may be implemented to comprise three sub-pixel units of red, green and blue sub-pixel unit. As another example, an OLED pixel unit may also be implemented to comprise other numbers of sub-pixel units. In this case, sub-pixel units in different OLED pixel units can be shared by drive control.

In the embodiments of the present disclosure, one light detection unit 222 may be correspondingly provided for each OLED pixel unit 221. In this case, the light detection unit may be disposed between the reset terminal of any one sub-pixel unit and the data line.

Figure 2:
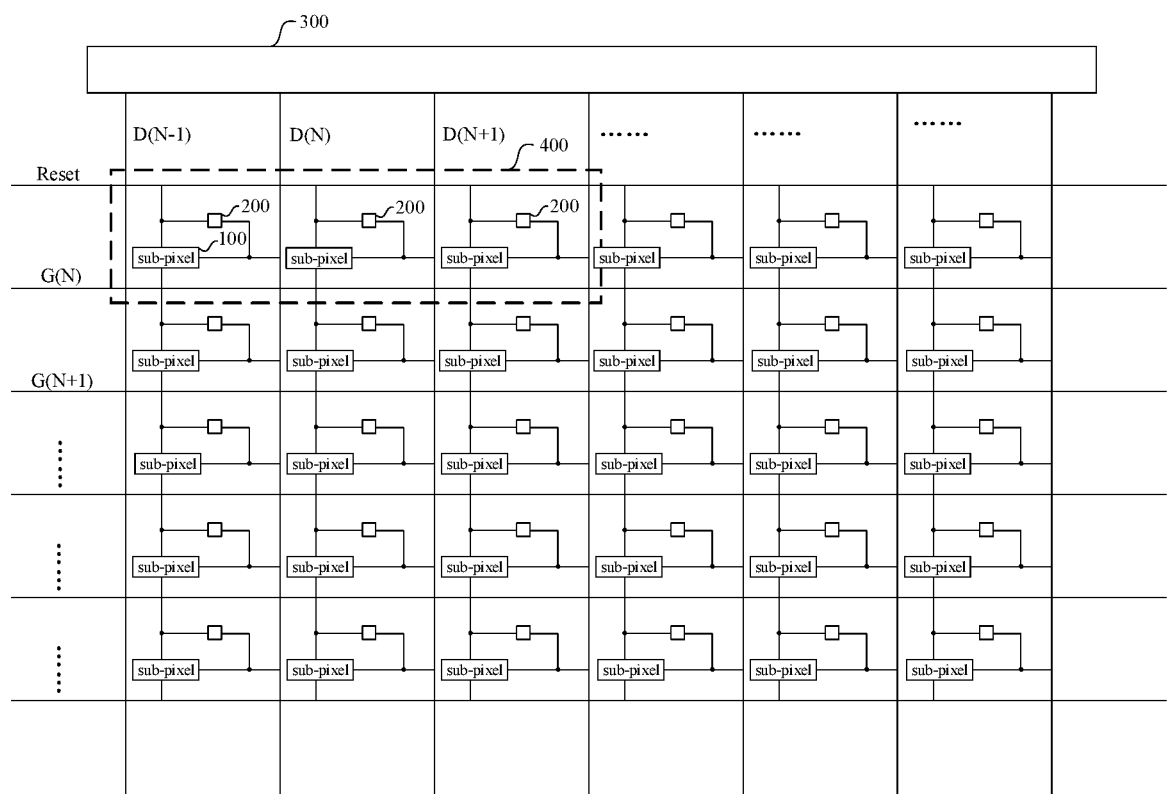
FIG. 2 is a schematic plan view of one example of an OLED display panel according to an embodiment of the present disclosure.

In other embodiments of the present disclosure, for each OLED pixel unit 221, the light detection units 222, the number of which is not more than the number of the sub-pixel units of the OLED pixel unit 221, may also be provided. In this case, one light detection unit 222 may be connected between the reset terminal of a portion of the sub-pixel units or each sub-pixel unit and the data line, respectively. FIG. 2 shows a case where one light detection unit 222 is connected between the reset terminal of each sub-pixel unit 222 and the data line.

In the embodiments of the present disclosure, the number of the light detection units is not specifically limited. A person skilled in the art can select the number of the light detection units according to a sensitivity of fingerprint recognition actually required. As shown in FIG. 1, in the case where a finger touches the OLED display panel 10, a ridge 31 of the fingerprint is in contact with the transparent substrate 1, and a valley 32 of the fingerprint is not in contact with the transparent substrate 1. The light detection unit corresponding to the ridge 31 of the fingerprint detects an intensity of a light reflected by the composite interface composed of the ridge 31 of the fingerprint and the transparent substrate 1. And the light detection unit corresponding to the valley 32 of the fingerprint detects the intensity of a light reflected by the transparent substrate 1 only. The light detection unit 222 converts the detected light intensity into an electrical signal. Under a control of a reset signal from the reset terminal, the electrical signal is output to the fingerprint recognition unit (not shown) through the data line. Thus, the fingerprint recognition unit can recognize the ridges and valleys of the fingerprint based on the received electrical signal so as to draw a fingerprint pattern, thereby performing fingerprint recognition.

In an exemplary embodiment, a orthographic projection of the light detection unit 222 on the substrate 21 does not overlap with a orthographic projection of the organic light emitting layer of the OLED pixel unit 221 on the substrate 21. As an example, the light detection unit is arranged in a staggered manner with the organic light emitting layer, thus the light reflected by the transparent substrate or the composite interface composed of the transparent substrate and the ridges of the fingerprint can enter into the light detection unit without being blocked. The staggered arrangement described above can recognize the ridges and valleys of the fingerprint more accurately, thereby improving the accuracy of fingerprint recognition.

FIG. 2 is a schematic plan view of one example of an OLED display panel according to an embodiment of the present disclosure. For clarity, the transparent substrate is not shown in FIG. 2. As shown in FIG. 2, the OLED array substrate 2 comprises a plurality of data lines, a plurality of scan lines, a plurality of OLED pixel units 400, a plurality of light detection units 200, and a fingerprint recognition unit 300. The OLED pixel unit 400 comprises three sub-pixel units 100. FIG. 2 shows a case where each OLED pixel unit 400 is connected with three light detection units 200. That is, one light detection unit 200 is connected between the reset terminal Reset of each sub-pixel unit 100 and the data line. It can be understood that each OLED pixel unit 400 may be connected with one or two or three light detection units 200 according to the requirements of the sensitivity of fingerprint recognition, which will not be described herein.

It should be noted that the one OLED pixel unit shown in FIG. 2 comprising three stripe-arranged sub-pixel units is merely exemplary. In the embodiments of the present disclosure, the arrangement of a plurality of sub-pixel units is not specifically limited. A person skilled in the art can arrange a plurality of sub-pixel units according to actual needs.

As an example, as shown in FIG. 2, the sub-pixel unit 100 is connected to the data line D(N), the scan line G(N), and the reset terminal Reset. The reset terminal Reset can receive a signal from the scan line G (N-x) as a reset signal, wherein the value of x is not less than 1. For example, the reset terminal Reset may receive a signal from the scan line G(N−1). The light detection unit 200 is connected between the reset terminal Reset of the sub-pixel unit 100 and the data line D(N). The fingerprint recognition unit 300 is connected to the data lines D(N−1), D(N), D(N+1).

In an exemplary embodiment, the plurality of scan lines can input scan signals when the OLED display panel is displaying, so as to open a plurality of OLED pixels included in a row corresponding to the scan lines. The plurality of data lines can input data signals corresponding to the video signals when the OLED display panel is displaying, so as to enable the plurality of OLED pixels included in a column corresponding to the data lines to emit light. Each OLED pixel unit 400 is connected to a corresponding data line and a corresponding scan line. That is, each sub-pixel unit 100 is connected to the corresponding data line and the corresponding scan line and can display according to the respective scan signal and data signal.

Figure 3:
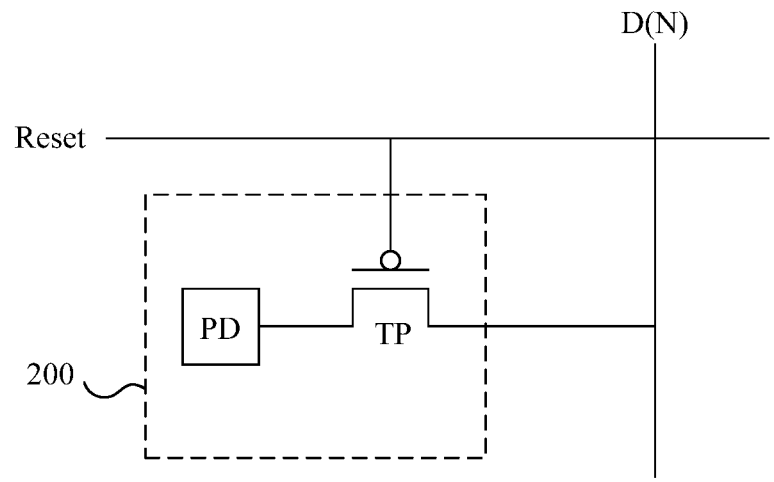
FIG. 3 is a schematic structural diagram of a light detection unit according to an embodiment of the present disclosure.

The light detection unit 200 can detect the properties of light, for example, the intensity of light, and generate a respective light detection signal. FIG. 3 is a schematic structural diagram of a light detection unit 200 according to an embodiment of the present disclosure. As shown in FIG. 3, the light detection unit 200 comprises a first transistor TP and a photodetector PD. A first electrode of the first transistor TP is coupled to the data line D(N). A second electrode of the first transistor TP is coupled to the photodetector PD. A control electrode of the first transistor TP is coupled to the reset terminal Reset. Each light detection unit 200 is connected between the reset terminal Reset of one sub-pixel unit 100 and the data line, and can detect a light reflected by the transparent substrate 1 to generate a light detection signal. In addition, the light detection unit 200 can output the light detection signal via the data line under a control of the reset signal from the reset terminal Reset. That is, the photodetector PD can detect the intensity of the light reflected by the transparent substrate 1 or the composite interface composed of the transparent substrate 1 and the ridges of the fingerprint. Then, the photodetector PD can convert the intensity of the detected light into an electrical signal (light detection signal). For example, the electrical signal is current. Since the reset signal from the reset terminal Reset can turn on the first transistor TP, the current is transmitted to the fingerprint recognition unit 300 via the data line and through the first transistor TP.

As an example, the first electrode of the first transistor TP is a drain, and the second electrode is a source. As another example, the first electrode of the first transistor TP is a source, and the second electrode is a drain. In an exemplary embodiment, the photodetector PD comprises a photodiode.

The fingerprint recognition unit 300 is connected to the plurality of data lines, and can recognize a fingerprint pattern based on light detection signals from the plurality of data lines. That is, the fingerprint recognition unit 300 receives the current transmitted via the data line, recognizes the ridges and valleys of the fingerprint based on the current, and draws a fingerprint pattern. Therefore, the drawn fingerprint pattern can be compared with the stored fingerprint pattern to perform fingerprint recognition.

In the embodiments of the present disclosure, the structure of the sub-pixel unit 100 is not specifically limited as long as the sub-pixel unit 100 can emit light. As an example, a transistor (not shown) in the sub-pixel unit 100 and the first transistor TP in the light detection unit 200 are P-type transistors. As another example, the transistor in the sub-pixel unit 100 and the first transistor TP in the light detection unit 200 are N-type transistors. It should be noted that the description herein is directed to the case where the transistor in the sub-pixel unit 100 and the first transistor TP in the light detection unit 200 are P-type transistors. A person skilled in the art can understand that, for the case where the transistor is an N-type transistor, the same function can be realized by changing the voltage of the control electrode of the transistor to the opposite polarity, which will not be described herein.

Figure 4:
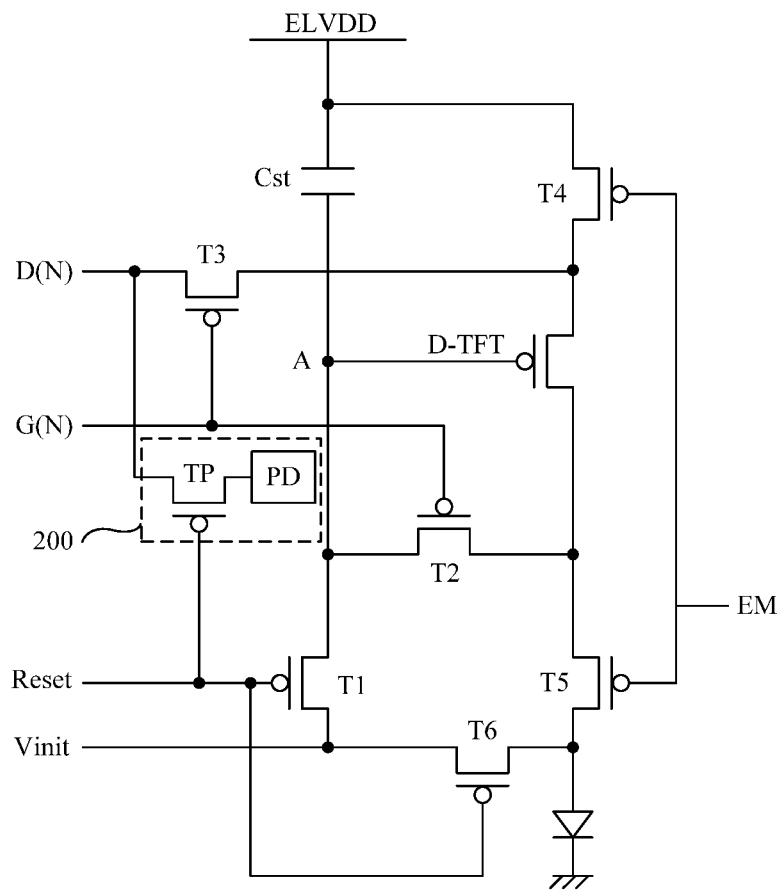
FIG. 4 is an exemplary pixel circuit schematic diagram of an OLED display panel according to an embodiment of the present disclosure.

FIG. 4 is an exemplary pixel circuit schematic diagram of an OLED display panel according to an embodiment of the present disclosure. The pixel circuit for the OLED display panel comprises a light emitting drive circuit being configured to control an OLED pixel unit to emit light, and a light detection unit being configured to detect a light emitted by a detection light resource to generate a light detection signal.

The transistor in FIG. 4 is a P-type transistor. It can be understood that the transistor in FIG. 4 may be an N-type transistor. As shown in FIG. 4, the light detection unit 200 comprises a first transistor TP and a photodetector PD. A first electrode of the first transistor TP is coupled to the data line D(N). A second electrode of the first transistor TP is coupled to the photodetector PD. A control electrode of the first transistor TP is coupled to the reset terminal Reset. In FIG. 4, an initialization transistor T1, a second transistor T2, a third transistor T3, a fourth transistor T4, a fifth transistor T5, a sixth transistor T6, a driving transistor DTFT, a capacitor Cst, and an OLED light emitting device constitute a light emitting drive circuit of a pixel unit. Among them, the driving transistor DTFT is used to drive the OLED light emitting device to emit light.

As shown in FIG. 4, a control electrode of the initialization transistor T1 is coupled to the reset terminal Reset, a first electrode of the initialization transistor T1 is coupled to a first terminal of the capacitor Cst, and a second electrode of the initialization transistor T1 is used for receiving an initial supply voltage Vint. A control electrode of the second transistor T2 is coupled to a corresponding scan line, a first electrode of the second transistor T2 is coupled to a second electrode of the driving transistor DTFT, and a second electrode of the second transistor T2 is coupled to the first terminal of the capacitor Cst. A control electrode of the third transistor T3 is coupled to the corresponding scan line, a first electrode of the third transistor T3 is coupled to the corresponding data line, and a second electrode of the third transistor T3 is coupled to a first electrode of the driving transistor DTFT. A control electrode of the fourth transistor T4 is coupled to a light emission control signal line, a first electrode of the fourth transistor T4 is coupled to the first electrode of the driving transistor DTFT, and a second electrode of the fourth transistor T4 is coupled to a second terminal of the capacitor Cst. A control electrode of the fifth transistor T5 is coupled to the light emission control signal line, a first electrode of the fifth transistor T5 is coupled to the OLED light emitting device, and a second electrode of the fifth transistor T5 is coupled to the second electrode of the driving transistor DTFT. A control electrode of the sixth transistor T6 is coupled to the reset terminal Reset, a first electrode of the sixth transistor T6 is used for receiving the initial supply voltage Vint, and a second electrode of the sixth transistor T6 is coupled to the OLED light emitting device. A control electrode of the driving transistor DTFT is coupled to the first terminal of the capacitor Cst, the first electrode of the driving transistor DTFT is coupled to the first electrode of the fourth transistor T4, and the second electrode of the driving transistor DTFT is coupled to the second electrode of the fifth transistor T5.

In the embodiments of the present disclosure, there is provided a driving method of the above-described pixel circuit. The pixel circuit comprises during a first time period t1, resetting an OLED pixel unit, during a second time period t2, storing a data voltage for displaying, and during a third time period t3, driving the OLED pixel unit to emit light.

Figure 5:
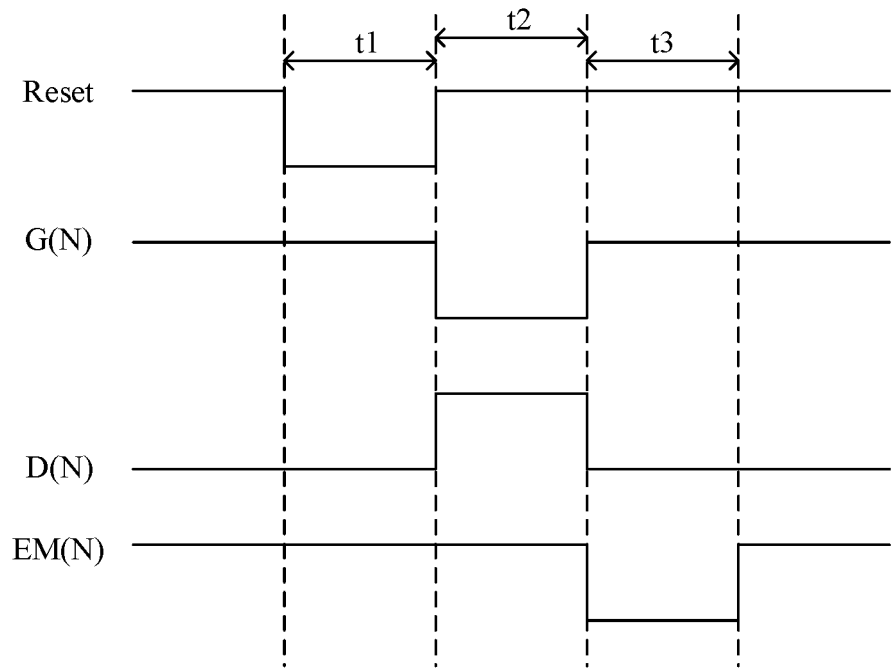
FIG. 5 is an operation timing chart of a pixel circuit of an OLED display panel according to an embodiment of the present disclosure.

FIG. 5 is an operation timing chart of a pixel circuit of an OLED display panel according to an embodiment of the present disclosure. In FIG. 5, a first time period t1 corresponds to a reset time period of the OLED pixel unit 400 of the OLED display panel 10; a second time period t2 corresponds to a storing time period for storing the data voltage for displaying; a third time period t3 corresponds to a light emitting time period of the OLED pixel unit 400 of the OLED display panel 10. For the example that the OLED pixel unit 400 comprises three sub-pixel units 100, the first time period t1 corresponds to the reset time period of respective sub-pixel unit 100, the second time period t2 corresponds to the data voltage storing time period of respective sub-pixel unit 100, and the third time period t3 corresponds to the light emitting time period of respective sub-pixel unit 100. During the first time period t1, a light detection signal is output through the data line. During the second time period t2, a data signal for display is input through the data line. The operation of the circuit in FIG. 4 will be described below with reference to the operation timing chart in FIG. 5.

As shown in FIG. 5, during the first time period t1, a low level signal is input into the reset terminal Reset. The initialization transistor T1 is turned on. An initial supply voltage Vint provides an initialization voltage to a A terminal of the capacitor Cst, so as to initialize the A terminal of the capacitor Cst and the control electrode of the driving transistor D-TFT, thereby resetting the OLED pixel units in Nth row. At this time, the OLED pixel units in Nth row do not emit light, while at least the OLED pixel units in (N+x)th rows emit monochromatic light. It should be noted that, specifically, which row (i.e. the value of x) emits the monochromatic light is determined by the timing of resetting, charging and emitting of the unit pixel corresponding to the resolution of the OLED display panel. At the same time, the sixth transistor T6 is also turned on. The initial supply voltage Vint provides a reverse bias voltage to the OLED light emitting device through the sixth transistor T6. In addition, the first transistor TP is also turned on. At this time, the photodetector PD can detect the intensity of the monochromatic light from the OLED pixel unit in (N+x)th row reflected by the transparent substrate 1 or the composite interface composed of the transparent substrate 1 and the ridges of the fingerprint, and convert the intensity into an electrical signal. In addition, since the first transistor TP is turned on, the electrical signal is output to the fingerprint recognition unit (not shown) via the data line D(N).

During the second time period t2, a low level signal is input into the scan line G(N). The second transistor T2 is turned on. At this time, the second transistor T2 is coupled between the control electrode of the driving transistor D-TFT and the first electrode to form a diode connection to compensate a threshold voltage of the driving transistor D-TFT. In addition, the third transistor T3 is also turned on. A data signal is input into the data line D(N), and the A terminal of the capacitor Cst can be charged via the third transistor T3 and the driving transistor D-TFT to store the data voltage representing the data signal in the capacitor Cst.

During the third time period t3, a low level signal is input into a light emission control signal line EM(N). The fourth transistor T4 is turned on. A first supply voltage ELVDD supplies a supply voltage to the drive transistor D-TFT. In addition, the fifth transistor T5 is also turned on. The OLED light emitting device may emit light by providing a driving voltage to the OLED light emitting device through the driving transistor D-TFT. In this time period, the data voltage stored in the capacitor Cst and the threshold voltage of the driving transistor D-TFT may be applied through the driving transistor D-TFT to enable the OLED light emitting device to emit light.

In addition, FIG. 4 is merely an exemplary circuit diagram. The circuit diagram included in the embodiments of the present disclosure may comprise various forms as long as the light detection unit 200 is connected between the reset terminal Reset of the corresponding OLED pixel unit and the data line D(N).

Figure 6:
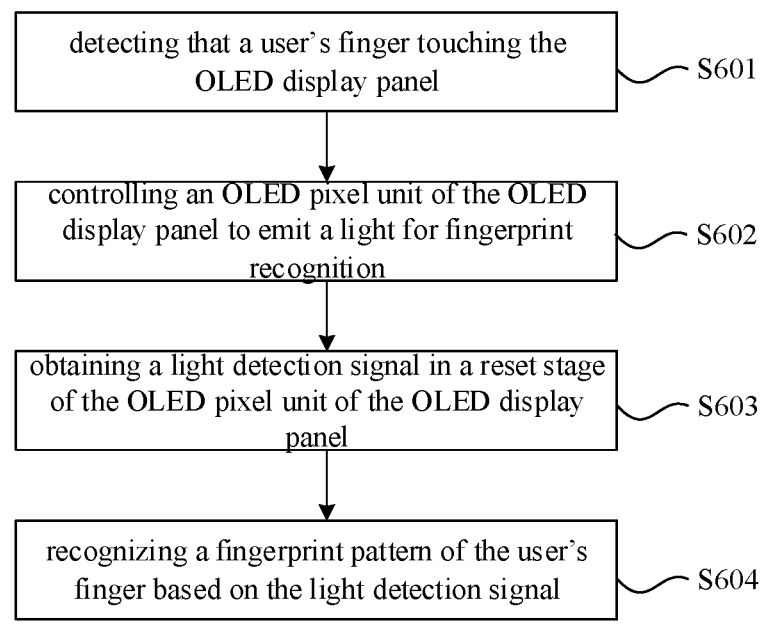
FIG. 6 is a flowchart of a method for fingerprint recognition using an OLED display panel according to an embodiment of the present disclosure.

In an embodiment of the present disclosure, a method for fingerprint recognition using an OLED display panel is also provided. FIG. 6 is a flowchart of a method for fingerprint recognition using an OLED display panel according to an embodiment of the present disclosure. The OLED display panel may be, for example, the OLED display panel as shown in FIG. 1 or FIG. 2. As shown in FIG. 6, the method comprises step S601 to step S604.

In step S601, it is detected that a user's finger touching the OLED display panel. As an example, when fingerprint recognition is required, the OLED display panel may display a region which indicates the user to perform fingerprint recognition. Then, the user can touch the fingerprint recognition region with a finger. In an embodiment of the present disclosure, it may be detected whether the user's finger touches the fingerprint recognition region for a predetermined time. After detecting that the user's finger has touched and stayed in the fingerprint recognition region for a predetermined time, step S602 is performed.

In step S602, the OLED pixel unit of the OLED display panel is controlled to emit light for fingerprint recognition. In the embodiments of the present disclosure, the light for fingerprint recognition may be monochromatic light. As an example, the OLED pixel unit may emit monochromatic light of short timing for fingerprint recognition. The short-timing monochromatic light does not affect human eyes from viewing the original screen displayed by the OLED display panel. For example, the short timing does not exceed 30 ms. In the embodiments of the present disclosure, the color of the monochromatic light is not specifically limited as long as the monochromatic light emitted by the OLED pixel unit is the light having the same property. For example, the monochromatic light may be a single color of light formed by red light, green light, blue light, or a combination thereof.

In step S603, a light detection signal is obtained in a reset stage of the OLED pixel unit of the OLED display panel. In the embodiments of the present disclosure, after the user's finger touching the transparent substrate of the OLED display panel, the OLED pixel unit emits monochromatic light, and the photodetector in the OLED display panel may detect the intensity of a light reflected by the transparent substrate or the composite interface composed of the transparent substrate and the ridges of the fingerprint, and convert the light intensity into an electrical signal (e.g. current) as a light detection signal. Then, in a reset stage of the OLED pixel unit of the OLED display panel, the light detection signal is output to the fingerprint recognition unit via the data line.

In step S604, a fingerprint pattern of the user's finger is recognized based on the light detection signal. As an example, after receiving the electrical signal as the light detection signal, the fingerprint recognition unit processes the electrical signal to determine whether the respective OLED pixel unit covered by the finger corresponds to the ridge or the valley of the fingerprint. Then, a fingerprint pattern is drawn, and the characteristics of the resulting fingerprint pattern are compared with the characteristics of the stored fingerprint pattern, thus performing fingerprint recognition.

In an exemplary embodiment, the entire display region of the OLED display panel may be used as the fingerprint recognition region.

In an exemplary embodiment, a region for fingerprint recognition may be specified in a display region of the OLED display panel. For example, the display region at the bottom of the OLED display panel may be designated as the fingerprint recognition region.

The application of fingerprint recognition using the above-described OLED display panel is described below. As an example, when using a display terminal comprising the OLED display panel described above for electronic payment, first, the display terminal recognizes that the user needs to perform fingerprint recognition, and displays a fingerprint recognition region on the OLED display panel to instruct the user to perform fingerprint recognition. The fingerprint recognition region may be the entire display region of the OLED display panel, or may be a specific display region of the OLED display panel (for example, a display region at the bottom of the OLED display panel).

When the user touching the fingerprint recognition region, the display terminal detects that the user's finger is placed and has stayed in the fingerprint recognition region. Then, the OLED display panel emits monochromatic light for fingerprint recognition, and the monochromatic light does not affect the normal display of the OLED display terminal. The OLED display panel obtains the user's fingerprint pattern and compares this fingerprint pattern with the stored fingerprint pattern for electronic payment.

In the embodiments of the present disclosure, the light detection unit is integrated in the OLED display panel. The light emitted by the OLED display panel can be used for display as well as a light source for fingerprint recognition. The OLED display panel can perform fingerprint recognition while displaying without affecting the accuracy of fingerprint recognition. In addition, each sub-pixel unit of the OLED display panel may correspond to one light detection unit, which can improve the accuracy and sensitivity of fingerprint recognition.

Figure 7:
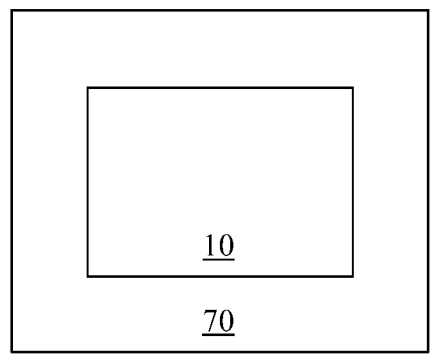
FIG. 7 is a schematic structural diagram of an electronic device according to an embodiment of the present disclosure.

In the embodiments of the present disclosure, an electronic device 70 comprising the above-described OLED display panel 10 is also provided. As shown in FIG. 7, the electronic device 70 may be, for example, a mobile phone, a tablet, a television, a display, a laptop, a navigator, a wearable device, an e-book reader, or the like.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

What is claimed is:

1. An OLED array substrate comprising:
   a plurality of scan lines;
   a plurality of data lines being configured to input data signals corresponding to the video signals;
   a plurality of OLED pixel units, each of the OLED pixel units being connected to a corresponding data line and a corresponding scan line and being connected to a corresponding reset terminal; and
   a plurality of light detection units, each of the light detection units being connected between the reset terminal of one of the OLED pixel units and the corresponding data line, and being configured to detect a light emitted by a detection light resource to generate a light detection signal and output the light detection signal via the corresponding data line under a control of a reset signal from the reset terminal during a reset time period of the OLED pixel unit,
   wherein the light detection unit comprises a first transistor and a photodetector, a first electrode of the first transistor is coupled to the corresponding data line, a second electrode of the first transistor is coupled to the photodetector, and a control electrode of the first transistor is coupled to the reset terminal.

2. The OLED array substrate according to claim 1, wherein the OLED pixel unit comprises a plurality of sub-pixel units, one of the light detection units is connected between the reset terminal of at least one of the sub-pixel units and the corresponding data line.

3. The OLED array substrate according to claim 1, wherein a orthographic projection of the light detection unit on a substrate of the OLED array substrate does not overlap with a orthographic projection of an organic light emitting layer of the OLED pixel unit on the substrate.

4. The OLED array substrate according to claim 1, wherein the photodetector comprises a photodiode.

5. The OLED array substrate according to claim 1, wherein the detection light resource is the OLED pixel unit.

6. The OLED array substrate according to claim 1, wherein the light emitted by the detection light resource is monochromatic light.

7. An OLED display panel comprising the OLED array substrate according to claim 1, further comprising:
   a transparent substrate disposed opposite to the OLED array substrate, and
   a fingerprint recognition unit which is connected to the plurality of data lines and is configured to recognize a fingerprint pattern based on the light detection signals from the plurality of data lines.

8. The OLED display panel according to claim 7, wherein the light emitted by the detection light resource is a light reflected by the transparent substrate.

9. A pixel circuit for the OLED display panel according to claim 7, comprising:
   a light emitting drive circuit being configured to control an OLED pixel unit to emit light; and
   a light detection unit being configured to detect a light emitted by a detection light resource to generate a light detection signal.

10. The pixel circuit according to claim 9, wherein the light detection unit comprises a first transistor and a photodetector, a first electrode of the first transistor is coupled to a corresponding data line, a second electrode of the first transistor is coupled to the photodetector, and a control electrode of the first transistor is coupled to a reset terminal.

11. The pixel circuit according to claim 10, wherein the light emitting drive circuit comprises a capacitor, an initialization transistor, a second transistor, a third transistor, a fourth transistor, a fifth transistor, a sixth transistor, a driving transistor, and an OLED light emitting device, wherein a control electrode of the initialization transistor is coupled to the reset terminal, a first electrode of the initialization transistor is coupled to a first terminal of the capacitor, and a second electrode of the initialization transistor is used for receiving an initial supply voltage,
   a control electrode of the second transistor is coupled to a corresponding scan line, a first electrode of the second transistor is coupled to a second electrode of the driving transistor, and a second electrode of the second transistor is coupled to the first terminal of the capacitor, a control electrode of the third transistor is coupled to the corresponding scan line, a first electrode of the third transistor is coupled to the corresponding data line, and a second electrode of the third transistor is coupled to a first electrode of the driving transistor,
   a control electrode of the fourth transistor is coupled to a light emission control signal line, a first electrode of the fourth transistor is coupled to the first electrode of the driving transistor, and a second electrode of the fourth transistor is coupled to a second terminal of the capacitor, a control electrode of the fifth transistor is coupled to the light emission control signal line, a first electrode of the fifth transistor is coupled to the OLED light emitting device, and a second electrode of the fifth transistor is coupled to the second electrode of the driving transistor,
   a control electrode of the sixth transistor is coupled to the reset terminal, a first electrode of the sixth transistor is used for receiving the initial supply voltage, and a second electrode of the sixth transistor is coupled to the OLED light emitting device, and a control electrode of the driving transistor is coupled to the first terminal of the capacitor, the first electrode of the driving transistor is coupled to the first electrode of the fourth transistor, and the second electrode of the driving transistor is coupled to the second electrode of the fifth transistor.

12. A driving method of the pixel circuit according to claim 9, comprising:
during a first time period, resetting an OLED pixel unit, during a second time period, storing a data voltage for displaying, and during a third time period, driving the OLED pixel unit to emit light.

13. A method for fingerprint recognition using the OLED display panel according to claim 7, comprising:
detecting a user's finger touching the OLED display panel;
controlling an OLED pixel unit of the OLED display panel to emit a light for fingerprint recognition;
obtaining a light detection signal in a reset stage of the OLED pixel unit of the OLED display panel, wherein the light detection signal is generated by detecting the light for fingerprint recognition reflected by the transparent substrate of the OLED display panel; and
recognizing a fingerprint pattern of the user's finger based on the light detection signal.

14. The method according to claim 13, further comprising: setting a region for fingerprint recognition in a display region of the OLED display panel, wherein the detecting that a user's finger touching the OLED display panel comprises: detecting that a user's finger touching the region for fingerprint recognition for a predetermined time.

15. The method according to claim 13, wherein the light for fingerprint recognition is monochromatic light.

16. An electronic device comprising the OLED display panel according to claim 7.

* * * * *